United States Patent [19]

Calder et al.

[11] Patent Number: 4,561,906
[45] Date of Patent: Dec. 31, 1985

[54] LASER ACTIVATED POLYSILICON CONNECTIONS FOR REDUNDANCY

[75] Inventors: Iain D. Calder, Nepean; Hussein M. Naguib, Kanata, both of Canada

[73] Assignee: Northern Telecom Limited, Montreal, Canada

[21] Appl. No.: 544,497

[22] Filed: Oct. 24, 1983

[30] Foreign Application Priority Data

Jun. 16, 1983 [CA] Canada ............................ 430698

[51] Int. Cl.⁴ ............... H01L 21/265; H01L 21/263; B05D 3/06
[52] U.S. Cl. .......................... 148/1.5; 29/574; 29/576 B; 148/187; 148/DIG. 93; 357/67; 357/91
[58] Field of Search ............ 29/571, 574, 576 B, 29/577 C; 148/1.5, 187; 357/67, 91

[56] References Cited

U.S. PATENT DOCUMENTS

| 4,268,950 | 5/1981 | Chattersee et al. | 29/571 |
| 4,351,674 | 9/1982 | Yoshida et al. | 148/1.5 |
| 4,387,503 | 6/1983 | Aswell et al. | 29/576 B |
| 4,409,724 | 10/1983 | Tasch, Jr. et al. | 29/571 |
| 4,415,383 | 11/1983 | Naem et al. | 148/187 |
| 4,462,150 | 7/1984 | Nishimura et al. | 29/576 B |
| 4,466,179 | 8/1984 | Kasten | 29/576 X |
| 4,468,855 | 9/1984 | Sasaki | 29/576 B |
| 4,523,962 | 6/1985 | Nishimura | 29/576 B |

FOREIGN PATENT DOCUMENTS 55-48926  4/1980  Japan .

OTHER PUBLICATIONS

Smith et al., IEEE–Jour. Solid St. Circuits, vol. SC-16, (1981), 506.
Yasaitis et al., IEEE–Electron Device Letts., EDL-3, (1982), 184.
Raffel et al., IEDM Tech. Digest, 1980, p. 132.
Fowler et al., IBM-TDB, 22 (1980) 5473-74.
Lasky, J. B., Jour. Appl. Phys., 53 (1982) 9038.
Herbst et al., Electronics Lett., 19 (Jan. 1983) 12.
Tamura et al., J. Appl. Phys., 50 (1979) 3783.

Primary Examiner—Upendra Roy
Attorney, Agent, or Firm—Stuart L. Wilkinson

[57] ABSTRACT

An integrated circuit is fabricated with some redundant capacity by forming potential electrically conducting links which can subsequently be made electrically when extra circuit capacity is required. Field oxide is grown on a silicon substrate and then a layer of polysilicon deposited over the oxide. At the redundancy sites where electrical connections may subsequently be made, an anti-reflective silicon nitride coating is deposited and photodefined. The areas of this coating are used as masks in order to diffuse dopant into the polysilicon at parts of the polysilicon laterally adjacent the redundancy sites. When later it is necessary to bring spare capacity into the circuit the complete circuit is scanned with a continuous wave laser. The laser melts the polysilicon under the nitride mask permitting the dopant to diffuse from the adjacent parts of the polysilicon and so form a conducting link. However under parts of the polysilicon not covered by an anti-reflective coating the polysilicon is not melted by the laser beam and so its conductivity remains unchanged. The fabrication process is self-aligned since the intrinsic or undoped region of the polysilicon is the same as the region which is melted. The method for making the electrical links does not require precise positioning and focussing of the laser beam as in known methods.

6 Claims, 10 Drawing Figures

LASER ACTIVATED POLYSILICON CONNECTIONS FOR REDUNDANCY

BACKGROUND OF THE INVENTION

1. Field of the Invention

This invention relates to integrated circuits (IC's) and particularly such circuits which have redundancy or spare capacity built into them.

2. Description of the Related Art

As integrated circuits become larger and more complex, the probability of conventional fabrication processes yielding a working circuit decreases. One method of overcoming this problem is the use of on-chip redundant circuit elements which can be selectively linked to the main circuit after the fabrication of the IC has been completed, to replace any defective elements in a large IC. In one known redundancy technique connections are broken by blowing metal fuses electrically. [Fitzgerald et al, "A 288Kb Dynamic RAM", Proceedings 1982 IEEE International Solid State Circuit Conference, page 68 (1982) and Ishihara et al, "A 256K Dynamic MOS RAM with Alpha Immune and Redundancy", ibid, page 74]. Another technique depends on blowing polysilicon fuses using a laser [Benevit et al, "256K Dynamic Random Access Memory", Proceedings 1982 IEEE International Solid State Circuit Conference, page 76 and Smith et al., "Laser Programmable Redundancy and Yield Improvement in a 64K DRAM", IEEE Journal of Solid-State Circuits, SC-16, p. 506, (1981)]. More recently, lasers have been used to make electrical connections. Vertical links are made between two metal layers separated by an insulating film when a laser drills a hole allowing metal to flow from one layer to another, [Raffel et al, "Laser Programmed Vias for Restructurable VLSI", IEDM Technical Digest, page 132 (1980)]. Lateral connections have also been made by laser welding two metal lines separated by a 2 micron gap to produce links of resistance under 1 ohm, [Yasaitas et al, "Low Resistance Laser Formed Lateral Links", IEEE Electron Device Letters, EDL-3, page 184 (1982)]. Links have also been formed with heavily doped polysilicon in which a short section remains intrinsic or high resistivity, [Minato et al, "A High-Speed Hi-CMOS II 4K Static RAM", IEEE Journal of Solid State Circuits 16, page 449, (1981)]. In this last method the application of a pulsed laser beam melts the intrinsic region and some of the neighboring doped polysilicon so that dopant flows into the intrinsic region and renders the link conductive. Links of resistance near 500 ohms have been formed.

Each of these three methods for forming lateral links has disadvantages. Sophisticated processing techniques are required for double metal levels, or for the fine lithography required for laser welding. These techniques can also be messy as molten metal may be splattered over the surrounding area. the methods require very precise positioning and focussing of the laser beam. Finally the polysilicon links do not have a low enough resistance for many applications.

SUMMARY OF THE INVENTION

An improvement on the last-mentioned technique is now proposed that allows low resistance polysilicon connections to be made without stringent requirements on lithography, laser beam positioning, or focussing, and without any possibility of splattered material.

According to one aspect of the invention there is provided in an integrated circuit fabrication process the method of forming a redundancy link by depositing a layer of polysilicon on a substrate, forming an anti-reflective coating over a region of the polysilicon layer at an intended site of the redundancy link and, using the anti-reflective coating as a mask, raising the conductivity of parts of the polysilicon layer adjacent to said region by introduction of a dopant wherein the link can be made conducting subsequently by scanning the integrated circuit with a laser beam having a wavelength related to the anti-reflective layer such that the polysilicon is melted under the anti-reflective layer to cause diffusion of dopant into said region from the adjacent high conductivity parts to make the link, but is not melted where no anti-reflective layer overlies the polysilicon.

The polysilicon is preferably deposited by low pressure chemical vapour deposition (LPCVD) and photolithographically patterned using a first mask level to form the makeable link together, optionally, with other elements of the integrated circuit.

The anti-reflection coating is preferably LPCV deposited silicon nitride which is patterned using a second mask level to form the mask/anti-reflection coating. The dopant can be introduced into the polysilicon layer by diffusion or ion implantation.

The conductivity of the parts of the polysilicon layer adjacent to the region can be increased by using diffusion of phosphorus to increase the conductivity of the intrinsic polysilicon to a level of about 1 milliohm-centimeter.

The integrated circuit can then be subjected to conventional IC fabrication techniques. For example a pyroglass layer can be deposited and a third mask level used to open contact windows to the polysilicon. Subsequently a layer of aluminum can be evaporated onto the structure and patterned with a fourth mask level to define metal contacts to the polysilicon. Finally a layer of Pyrox (Trade Mark) can be deposited over the entire integrated circuit.

Laser processing to make the links is preferably carried out using a continuous wave laser such as an argon ion laser. Laser scanning can be relatively indiscriminate since, although the laser beam may cover a much larger area than the makeable links, only under the regions of the anti-reflection coating is enough laser power absorbed to cause melting. Laser scanning should be carried out in a direction parallel to the direction in which electrical current will flow in the makeable links, typically with a 10 micron step between successive scans for a typical laser beam diameter of 50 microns. Laser power required for satisfactory connections depends on field oxide thickness, laser beam width, scan rate, ambient temperature and combined thickness of overlying layers.

The intrinsic regions of the polysilicon links must be long enough that there is no diffusion of dopant from the doped regions to the center of the link during conventional high temperature steps involved in IC fabrication. Typically phosphorus diffuses a distance of about 3 microns during high temperature processing so that if current high temperature processing steps are used the link in the intrinsic regions of the polysilicon should be at least 10 microns long.

BRIEF DESCRIPTION OF THE DRAWINGS

An embodiment of the invention will now be described by way of example, with reference to the accompanying drawings in which.

DESCRIPTION OF THE PREFERRED EMBODIMENT

Figure 1:
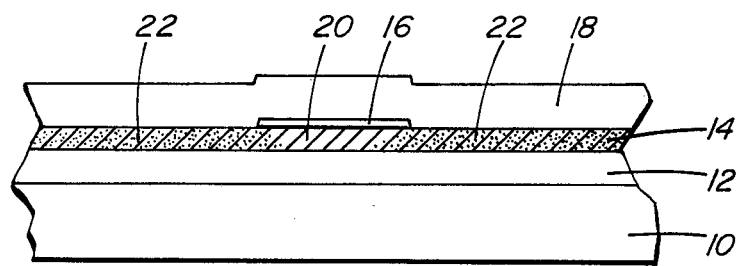
FIG. 1 is a sectional view through a part of an integrated circuit according to the invention illustrating a makeable electrically conducting link.

Referring in detail to the drawings, FIG. 1 shows a sectional view through part of an integrated circuit. The circuit has a silicon substrate 10 on which there are formed a field oxide layer 12, a polysilicon layer 14, a silicon nitride layer 16, and a glass layer 18. The silicon nitride layer 16 extends over only a central zone of the illustrated part of the integrated circuit. Under that central zone, the polysilicon is intrinsic and relatively high resistivity whereas laterally adjacent zone 22, the polysilicon, is relatively more conducting.

The intrinsic or relatively high resistivity polysilicon forms a high resistance region between the two low resistance regions 22 and thus the polysilicon link between the two regions 22 is essentially non-conducting. To render the region 20 highly conducting to form a link between the regions 22, impurity species within the regions 22 are caused to diffuse under the silicon nitride layer 16. This is achieved using a continuous wave laser having a wavelength related to the thickness of the anti-reflective layer 16. The relationship between the wavelength and the thickness of the anti-reflection layer is such that when the laser beam is scanned over the whole of the integrated circuit it melts the polysilicon under the anti-reflection layer but has no effect on the remaining polysilicon. When the intrinsic polysilicon 20 melts, diffusion of dopant from the regions 22 occurs to make the link between the regions 22 conducting.

In this way redundancy or spare capacity can be built into an integrated circuit.

Typically the makeable links will extend between a controlling part of the circuit and a duplicated part of the circuit. Subsequently if it is found a part of the chip or wafer on which a corresponding original part is faulty, then the original part is cut out of the circuit by activating, for example, a fusible link as described in the introduction to this specification, and the duplicated circuit part is brought into the circuit by continuous wave laser scanning of the appropriate makeable link or links.

Figure 2:
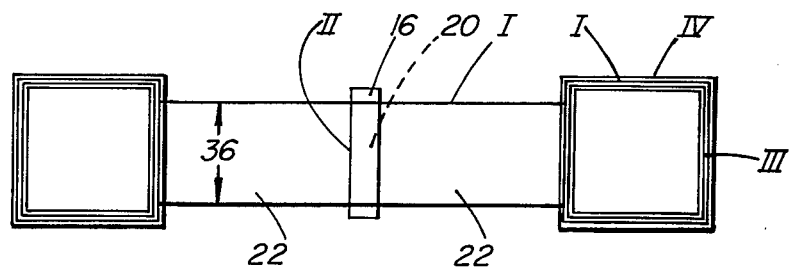
FIG. 2 is a plan view of a polysilicon link.

Referring to the plan view of FIG. 2 and the process sequence illustrated in FIG. 3, the makeable link 22, is located beneath the silicon nitride layer 16 in a central part of the polysilicon link 14. The plan view shows the surrounding features of the link formed within a silicon integrated circuit.

Figure 3A:
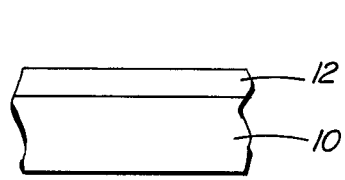
FIGS. 3(a) to 3(h) are sectional views showing a process sequence for fabricating an integrated circuit according to the invention.
Figure 3B:
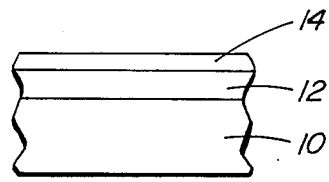

Referring to FIG. 3, a 1.45 micron field oxide layer 12 is thermally grown on a silicon substrate 10, FIG. 3(a). Next a 500 nm polysilicon film 14 is low pressure chemically vapour deposited at 625° C. and photolithographically patterned using a first mask level I to form the link site, FIG. 3(b).

Figure 3C:
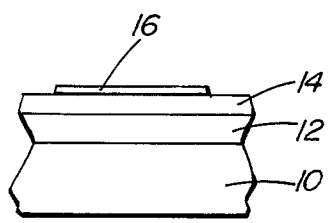
Figure 3D:
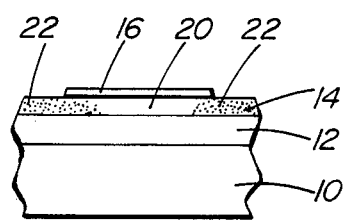
Figure 3E:
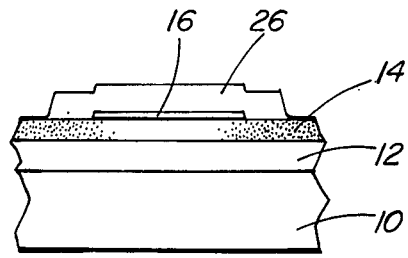
Figure 3F:
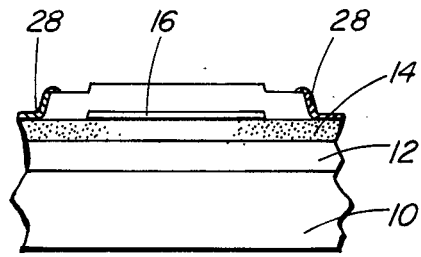
Figure 3G:
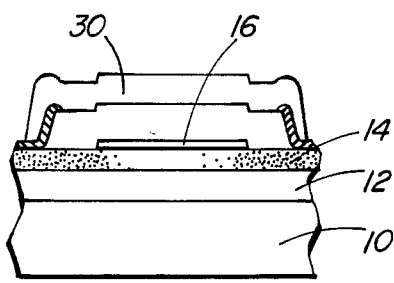

A 60 nm layer 16 of silicon nitride is then low pressure chemically vapour deposited at 650° C. and is photolithographically patterned using a second mask level II to form the regions 16 of silicon nitride which are to function both as a diffusion mask and an anti-reflection coating for subsequent laser processing, FIG. 3(c). Phosphorus is then diffused into the polysilicon to achieve a resistivity in regions 22 of 1 milliohm-centimeter, FIG. 3(d). The remaining part of the wafer is subsequently processed using relatively conventional fabrication steps. A pyroglass layer 26 is deposited and a third mask level III is used to open contact windows to the polysilicon, FIG. 3(e). A layer of aluminum 28 is then evaporated onto the structure and patterned with a fourth mask level IV to define metal contacts to the polysilicon, FIG. 3(f). Finally a layer of Pyrox is deposited over the entire integrated circuit, FIG. 3(g).

Figure 3H:
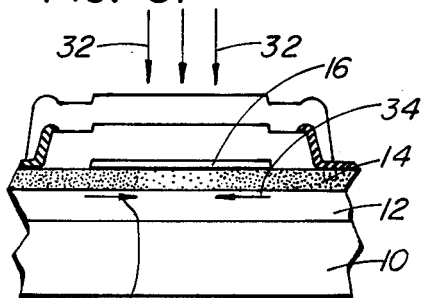

If, subsequently, it is decided to electrically make one of the redundancy links, laser processing is carried out, FIG. 3(h) using a continuous wave argon ion laser with a power output 32 of about 3 watts, a beam diameter of about 50 microns and a scan rate of 50 centimeters per second while the ambient temperature of the integrated circuit is maintained at 300° C. Laser scanning is carried out in a direction parallel to the direction in which electrical current will flow with a 10 micron step between subsequent scans. The laser power required for satisfactory dopant diffusion 34 to create electrical connections is greater for a field oxide thinner than 1.45 microns, a wider laser beam, a higher scan rate, or a lower ambient temperature. Although the pyroglass and Pyrox layers 26 and 30 are essentially transparent to the output of an argon ion laser, the laser power requirement can also vary by +/−10 percent depending on the combined thickness of these layers.

As indicated previously, the intrinsic region of each polysilicon link must be long enough so that there is no diffusion of dopant from the doped regions to the center of the link during the conventional high temperature steps involved in integrated circuit fabrication. For a phosphorus dopant, this distance is about 3 microns; therefore the intrinsic regions should be at least 10 microns long. On the other hand, diffusion in the laser activated molten silicon is not sufficient to obtain the required minimal resistivity if the link regions are longer than about 18 microns using the laser treatment conditions defined previously. A reduced laser scan speed would make longer links possible. For best results the intrinsic or high resistivity region has a length in the range of 12 to 16 microns. It should be noted that the electrical resistance of the links decreases as the link width 36 increases. Therefore the widest link possible should be used commensurate with the space available on the integrated circuit wafer or chip. If the link width is equal to the total link length (between metal contacts) of about 25 microns, a resistance of about 20 ohms results since the resistivity of laser annealed polysilicon is reduced to about 0.5 milliohms-centimeters. The low resistance is achieved relatively quickly using a continuous wave laser rather than a pulsed laser because the much larger melt time allows much greater dopant diffusion.

The thickness of the silicon nitride layer 16 is about 60 nm. Any odd multiple of 60 nm could be used to the same effect but better thickness control is possible with the 60 nm layer.

The specific embodiment described uses diffusion to reduce the resistance of the polysilicon at each side of the link. The effect of diffusion is to undercut the nitride mask so that the diffused region is not completely aligned with the region which is subsequently laser irradiated to make an electrical link. In this respect ion implantation of dopant is preferred especially for shorter links. If ion implantation is used then photoresist used during photolithographic patterning of the silicon nitride is not removed until after the impurity species have been implanted. Links of the order of 2 μm in length can be made using ion implantation.

Other high power cw lasers (e.g. krypton) could be used instead of the argon ion laser although the latter is more efficient and is readily available. The thickness d of the anti-reflective layer, the index of refraction n of the layer and the wavelength of the laser are related by the following expression:

$$d\delta\lambda/4n$$

with a 10% tolerance allowable in the anti-reflective coating thickness.

What is claimed is:

1. In an integrated circuit fabrication process the method of forming a redundancy link comprising depositing a layer of polysilicon on a substrate, forming an anti-reflective coating of a region of the polysilicon layer at an intended site of the redundancy link and, using the anti-reflective coating as a mask, raising the conductivity of parts of the polysilicon layer adjacent to said region by introducing a dopant, and electrically making said link by scanning the integrated circuit with a laser beam having a wavelength related to the anti-reflective layer such that the polysilicon is melted under the anti-reflective layer to cause diffusion of dopant into said region from the adjacent raised conductivity parts, thereby to make an electrical connection at the link, but is not melted where no anti-reflective layer overlies the polysilicon.

2. A method as claimed in claim 1 further comprising forming the anti-reflective coating by low pressure chemically vapour depositing silicon nitride.

3. A method as claimed in claim 1 further comprising forming the higher conductivity parts of the polysilicon layer by diffusing a dopant into the polysilicon layer using the silicon nitride as a mask.

4. A method as claimed in claim 1 further comprising forming the higher conductivity parts of the polysilicon layer by ion implantation of impurity species into the polysilicon using the silicon nitride as a mask.

5. A method as claimed in claim 1 further comprising depositing a dielectric layer, opening contact windows through the dielectric layer to the polysilicon, evaporating metallization through the windows, and depositing a further layer of dielectric over the integrated circuit.

6. A method as claimed in claim 1 in which the thickness of the anti-reflective coating is an odd multiple of 0.06 microns thereby adapting the integrated circuit for selective activation of the redundancy links using an argon ion laser with an output wavelength of 0.5 microns.

* * * * *